(12) United States Patent
Gharib et al.

(10) Patent No.: US 7,398,818 B2
(45) Date of Patent: Jul. 15, 2008

(54) FLUIDIC PUMP FOR HEAT MANAGEMENT

(75) Inventors: Morteza Gharib, San Marino, CA (US); Derek Rinderknecht, Pasadena, CA (US); Matthew Tasooji, San Marcos, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/320,167

(22) Filed: Dec. 27, 2005

(65) Prior Publication Data

US 2006/0196642 A1    Sep. 7, 2006

Related U.S. Application Data

(60) Provisional application No. 60/639,682, filed on Dec. 28, 2004.

(51) Int. Cl.
*H05K 7/20*    (2006.01)

(52) U.S. Cl. ...................... 165/80.4; 361/699

(58) Field of Classification Search .............. 165/80.4, 165/104.33; 361/699
See application file for complete search history.

(56) References Cited

U.S. PATENT DOCUMENTS

| | | | |
|---|---|---|---|
| 6,254,355 B1 | 7/2001 | Gharib | |
| 6,278,847 B1 | 8/2001 | Gharib et al. | |
| 6,506,025 B1 | 1/2003 | Gharib | |
| 6,580,503 B2 | 6/2003 | Gharib et al. | |
| 6,582,208 B2 | 6/2003 | Gharib | |
| 6,608,668 B2 | 8/2003 | Gharib et al. | |
| 6,654,102 B1 | 11/2003 | Modares et al. | |
| 6,670,699 B2 * | 12/2003 | Mikubo et al. ............ 257/678 |
| 6,679,687 B2 | 1/2004 | Gharib | |
| 6,717,172 B2 | 4/2004 | Gharib et al. | |
| 6,956,230 B1 | 10/2005 | Gharib et al. | |
| 7,006,132 B2 | 2/2006 | Pereira et al. | |
| 7,033,132 B2 | 4/2006 | Gharib | |
| 7,104,313 B2 * | 9/2006 | Pokharna et al. ............ 165/80.4 |
| 7,107,777 B2 * | 9/2006 | Vaiyapuri et al. ........... 62/259.2 |
| 2001/0046445 A1 | 11/2001 | Gharib | |
| 2002/0044867 A1 | 4/2002 | Gharib | |
| 2002/0075474 A1 | 6/2002 | Gharib et al. | |
| 2002/0113963 A1 | 8/2002 | Gharib et al. | |
| 2002/0149691 A1 | 10/2002 | Pereira et al. | |
| 2002/0162956 A1 | 11/2002 | Gharib et al. | |
| 2003/0121644 A1 * | 7/2003 | Tonosaki et al. ........ 165/104.25 |
| 2003/0164231 A1 | 9/2003 | Goodson et al. | |
| 2003/0209006 A1 | 11/2003 | Gharib et al. | |

(Continued)

FOREIGN PATENT DOCUMENTS

WO    03/017000    2/2003

(Continued)

*Primary Examiner*—Allen J. Flanigan
(74) *Attorney, Agent, or Firm*—Law Office Scott C Harris

(57) ABSTRACT

A heat producing device is placed in contact with a heat exchanger that is fluidically coupled to a fluid pump. The fluid pump operates to pumps fluid through a closed fluidic system between the heat exchanger and a spot where the heat can be dissipated. In an aspect, an actuator forces fluid to be pumped without passing through a wall of the pump. One aspect uses an impedance pump as the pumping element.

15 Claims, 1 Drawing Sheet

U.S. PATENT DOCUMENTS

| | | |
|---|---|---|
| 2003/0233143 A1 | 12/2003 | Gharib et al. |
| 2003/0235504 A1* | 12/2003 | Lemoff et al. ............... 417/50 |
| 2004/0018100 A1* | 1/2004 | Takagi et al. ............... 417/322 |
| 2004/0031594 A1 | 2/2004 | Vaiyapuri et al. |
| 2004/0037035 A1* | 2/2004 | Ohashi et al. ............... 361/687 |
| 2004/0048778 A1 | 3/2004 | Druggan |
| 2004/0101414 A1 | 5/2004 | Gharib et al. |
| 2004/0136846 A1 | 7/2004 | Gharib |
| 2004/0151607 A1 | 8/2004 | Gharib |
| 2004/0184237 A1* | 9/2004 | Chang ....................... 361/699 |
| 2004/0193035 A1 | 9/2004 | Gharib et al. |
| 2005/0098299 A1* | 5/2005 | Goodson et al. ........... 165/80.3 |
| 2005/0231914 A1* | 10/2005 | Mikubo et al. ............. 361/699 |
| 2005/0275494 A1 | 12/2005 | Gharib et al. |
| 2005/0277865 A1 | 12/2005 | Gharib et al. |
| 2006/0120048 A1* | 6/2006 | Houle et al. ................ 361/699 |
| 2006/0131003 A1* | 6/2006 | Chang et al. ........... 165/104.33 |
| 2006/0139882 A1* | 6/2006 | Mikubo et al. ............. 361/699 |
| 2006/0195180 A1 | 8/2006 | Kheradvar et al. |
| 2006/0196642 A1 | 9/2006 | Gharib et al. |
| 2006/0209193 A1 | 9/2006 | Pereira et al. |
| 2006/0216173 A1 | 9/2006 | Kheradvar et al. |
| 2007/0038016 A1 | 2/2007 | Gharib et al. |

FOREIGN PATENT DOCUMENTS

| | | |
|---|---|---|
| WO | WO 2004/017698 | 2/2004 |
| WO | 2005/115502 | 12/2005 |
| WO | 2005/117240 | 12/2005 |
| WO | 2006/071930 | 7/2006 |
| WO | 2006/074484 | 7/2006 |

* cited by examiner

FLUIDIC PUMP FOR HEAT MANAGEMENT

This application claims priority to U.S. Provisional Application 60/639,682, filed Dec. 28, 2004. The disclosure of the prior application is considered part of (and is incorporated by reference in) the disclosure of this application.

BACKGROUND

Chip based devices often require cooling. Modern microprocessors and other type devices may have a specific hot spot that gets hotter than other locations. For example, in a microprocessor, this hotspot may be the location of a high density circuitry portion that does arithmetic calculations or signal processing, or may be the location of the processor core itself. Other spots on the chip may be less sensitive to heating effects and/or may produce less heat. Other devices may include analogous hotspot locations. For example, there are hotspots on memory chips, cell phone electronics, and others.

SUMMARY

The present application defines a microsized heat exchanger which can be used to manage the heat in electronics devices where a certain portion needs to be cooled, and cooling of other portions of the device is less crucial.

DETAILED DESCRIPTION

The general structure and techniques, and more specific embodiments which can be used to effect different ways of carrying out the more general goals are described herein.

An embodiment shows a microsized heat exchanger integrated into an electronics device. In one embodiment, the heat exchanger is actually integrated into the microchip. Another embodiment implements the heat exchanger as a separate modular unit that can be thermally coupled to the device.

Figure 1:
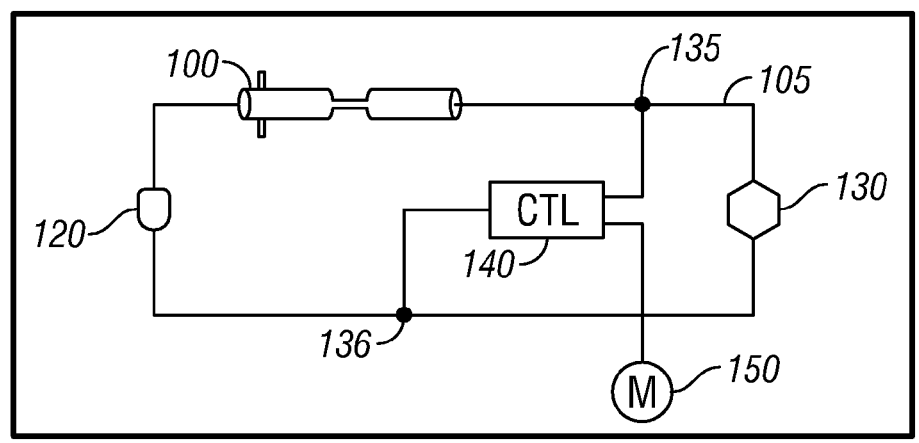
FIG. 1 shows a block diagram of the system.

FIG. 1 illustrates the microfluidic system. A fluid is maintained within a closed system 105 defined within conduits that are formed either on, or in the electronic device.

A special solid state pump 100 is a pump that drives the fluid. A first location 120 forms a heat capture region, where heat is captured from some electronic device. This may use a heat exchanger shown as 120, formed on the chip. A second, heat delivery region 130 forms the area where heat is delivered to a heat sink that dissipates the heat. In this way, the heat transfer device moves the localized heat from the hot region 120 and deposits that heat to a heat sink downstream at 130. The heat sink can be a passive heat sink, or a may be a more active heat sink such as a fan using forced convection, fluidic cooling system, or a Peltier cooler.

The pump 100 should be a small pump, with minimal number of moving parts and no parts that extend into the inside of the fluidic conduit. A preferred pump may be the so-called impedance pump, of the type described in U.S. Pat. No. 6,254,355, the disclosure of which is herewith incorporated by reference. The impedance pump takes advantage of the differences in impedance between the different mechanical segments of the fluid chamber. The pump takes advantage of the pressure difference experienced by fluids in different mechanical impedance segments. A change to a pressure inside an elastic container is created, causing varying pressures in different segments which have different fluidity characteristics. The constriction in the segment must occur sufficiently rapidly to prevent pressures in different segments from equalizing to the total system pressure. In that way, a pumping effect is caused, which forces the fluid from the portion where the higher pressure has been induced, to the lower pressure portion.

An advantage of this pump is that it can be made relatively small, it only requires microfluidic conduits, and a compression part, which can be, for example, a pincher or squeezer. The compression part can be mechanical or electronic. No parts need to extend inside the fluidic chambers.

The pump can be formed from any kind of microfluidic technique, including micromachining on the same substrate as the electronics. Alternatively, the pump can be thermally coupled to the electronics. The excitation of the impedance pump can be one of electromagnetic, piezoelectric, ferroelectric, electrostatic, actuation of a shape memory alloy, or movement based on a conducting polymer, for example. Any form of movement can be used for the excitation of the fluidic conduit.

Figure 2:
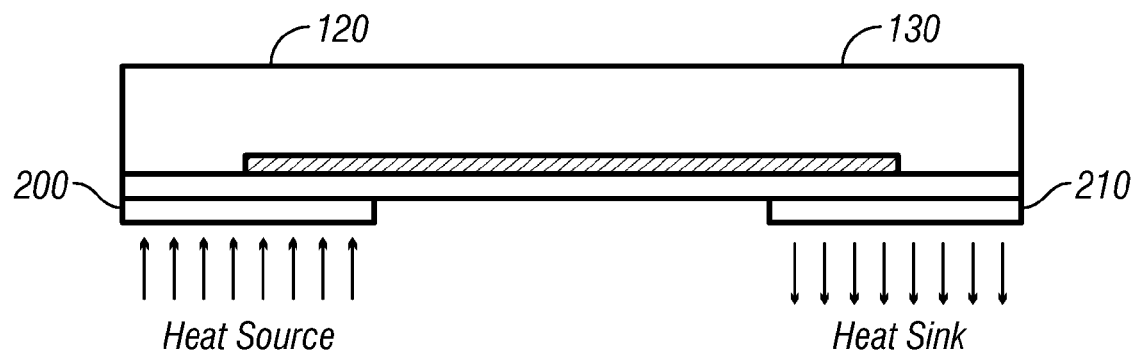
FIG. 2 shows a side view illustrating the flow of heat.

In operation, the device of FIG. 1 captures heat from a heat capture region 120. The pumping action by the impedance pump sends that heat to heat delivery region 130. FIG. 2 shows how the heat capture region 120 can be in the area of a heat source 200. This may be, for example, a heat exchanger located adjacent the hotspot on a chip. Heat delivery region 130 can be, for example, a heat sink 210 of the type noted above.

An important feature is that a very small size pump that is valveless and has no parts that extend within the fluidic system, can be used along with a closed microfluidic system. The closed system makes it feasible to seal many components together. The pump does not have any parts that need to extend into the sealed system. Since the pumping part forms a totally enclosed system, it can be located in contact with an electronically operated and operable device without concern for damage to the electronics that could otherwise be caused by the cooling liquid. The pumping occurs without any pump part extending into the fluid conduit, therefore, making it easier to seal against fluid leakage.

Moreover, the fluid movement caused by the pump is intermittent and occurs in pulses. The pulsed movement of the fluid may enhance convective mixing within the working fluid, and may in turn allow more heat energy to be carried away from the source. This can minimize the possibility of fluid overtemperature conditions, e.g., boiling, or the like. By maximizing the convective mixing, the thermal release at the heat sink 210 may be improved.

In the embodiment, a microfluidic mixer device is located at 120, over the heat source. This can induce a maximal amount of thermal mixing within the heat exchanging fluid. A diffusion region is located at 130, where the flow of area expands over an extended area, and places a maximum amount of heat in contact with the heat sink.

A first thermocouple 135 and a second thermocouple 136 may allow monitoring the chip and fluid temperatures, and may be connected, for example, to a controller 140. The controller can be used to automatically adjust the amount of pumping based on the temperature. For example, the controller may control more pumping when the temperature exceeds a certain threshold. Another alternative is that a manual control shown at 150 can be provided.

The manual control may be used to tune the impedance pump to operate at a maximum operating level for the specific characteristics of the chip. For example, the chip may be brought to resonance in order to produce a maximum amount of pumping. In addition, the controller or the manual control may allow the heat management device to be tuned in order to perform optimally at different levels of chip activity. For example, one level of chip activity may produce maximal pumping (e.g., pumping at or close to resonance), while another level of chip activity may produce some lesser amount of pumping.

The controller may also provide for actuating said pump intermittently and in bursts as suggested in the aforementioned U.S. Pat. No. 6,254,355.

In the embodiments, the system can be made with micromachining, or using conventional etching. Soft lithography may also be used depending on different characteristics.

Although only a few embodiments have been disclosed in detail above, other embodiments are possible and are intended to be encompassed within this specification. The specification describes specific examples to accomplish a more general goal that may be accomplished in other way. This disclosure is intended to be exemplary, and the claims are intended to cover any modification or alternative which might be predictable to a person having ordinary skill in the art. For example, other kinds of controls are contemplated.

Also, only those claims which use the words "means for" are intended to be interpreted under 35 USC 112, sixth paragraph. Moreover, no limitations from the specification are intended to be read into any claims, unless those limitations are expressly included in the claims.

What is claimed is:

1. An apparatus, comprising:
an electronically operated device; a fluid filled conduit, thermally in contact with at least a portion of said heat producing device, and includes a fluid therein;
a pump, of a type that pumps said fluid through the conduit, but does not extend through any outer walls of the conduit to the inside of the conduit; and
wherein said fluid filled conduit includes a first portion forming said thermally contact, and includes a second portion which releases heat, wherein said conduit is formed of a plurality of mechanical segments having different fluidic characteristics, and said pump is an impedance pump that causes fluid to flow based on fluidic impedance differences between different mechanical segments of the conduit, and which includes an actuator that reduces an internal area of at least one area of the conduit to cause said fluid to flow,
and further comprising a controller which controls said actuator to a resonance point of the system that creates a maximum pumping effect.

2. An apparatus as in claim 1, wherein said electronically operated device includes an electronic device.

3. An apparatus as in claim 1, wherein said actuator is one of electromagnetic, piezoelectric, ferroelectric, electrostatic, based on actuation of a shape memory alloy, or based on actuation of a conducting polymer.

4. An apparatus as in claim 1, wherein said fluid filled conduit includes a heat exchanger at said first portion, exchanging heat with said electronically operated device.

5. An apparatus as in claim 1, wherein said fluid filled conduit includes a heat sink, at said second portion, operating to release heat.

6. An apparatus as in claim 5, wherein said heat sink is an active heat sink.

7. An apparatus as in claim 1, further comprising at least one temperature sensor, and wherein said controller operates based on information received from said temperature sensor.

8. An apparatus as in claim 1, further comprising a microfluidic mixer, fluidly coupled to the fluid filled conduit, that maximizes an amount of thermal mixing within a fluid within the fluid filled conduit.

9. An apparatus, comprising:
a chip formed of a substrate with at least one electronically operated device thereon;
a fluid filled conduit, also formed on said chip, and having a first portion which is thermally in contact with at least one portion of said electronically operated device, and at least another portion forming a heat releasing portion; and
a pumping part, operating to pump fluid in the chip without having any portion extending inside walls of said fluid filled conduit, wherein said conduit is formed of a plurality of mechanical segments having different fluidic characteristics, and said pumping part includes an impedance based pump that causes fluid to be pumped based on fluidic impedance differences between different mechanical segments forming the conduit, wherein said impedance pump further includes an actuator that causes a pressure increase in at least one area of at least one of said mechanical segments; and
a controller, that controls a characteristic of said actuator, to change a characteristic of pumping, wherein said controller controls said actuaotor to operate said pumping part intermittently and in bursts.

10. An apparatus as in claim 9, further comprising a temperature sensor, sensing a temperature associated with several electronically operated device, and increasing an amount of pumping when said temperature increases.

11. A method, comprising:
forming a fluid filled conduit having at least one portion in contact with a heat producing device;
pumping fluid through the conduit without using any part that extends inside walls of the conduit, to draw heat from said at least one portion, and to pump said heat to at least a second portion; and
cooling said fluid at said second portion, wherein said pumping comprises using a conduit having a plurality of mechanical segments with different fluidic characteristics,
actuating at least one of said mechanical segments to cause fluid to flow between the different mechanical segments based on said different fluidic characteristics; and
controlling said actuating to a resonant point of the system that produces a maximum pumping effect.

12. A method as in claim 11, further comprising sensing a heat associated with said heat producing device, and controlling an amount of said pumping based on said sensing.

13. A method as in claim 11, wherein said forming comprises forming a heat exchanger in contact with said heat producing device.

14. An apparatus as in claim 9, further comprising a microfluidic mixer, fluidly coupled to the fluid filled conduit, and that maximizes an amount of thermal mixing within a fluid that is within the fluid filled conduit.

15. A method as in claim 11, further comprising mixing fluid within said fluid filled conduit.

* * * * *